United States Patent
Nakatani et al.

[11] Patent Number: 6,108,903
[45] Date of Patent: Aug. 29, 2000

[54] CONNECTING MEMBER OF A CIRCUIT SUBSTRATE AND METHOD OF MANUFACTURING MULTILAYER CIRCUIT SUBSTRATES BY USING THE SAME

[75] Inventors: Seiichi Nakatani, Hirakata; Akihito Hatakeyama, Suita; Kouji Kawakita, Jouyou; Hiroshi Sogou, Nishinomiya; Tatsuo Ogawa, Amagasaki; Tamao Kojima, Suita, all of Japan

[73] Assignee: Matsushita Electric Industrial Co., Ltd., Osaka, Japan

[21] Appl. No.: 08/582,930

[22] Filed: Jan. 4, 1996

Related U.S. Application Data

[62] Division of application No. 08/308,982, Sep. 20, 1994, Pat. No. 5,484,647.

[30] Foreign Application Priority Data

Sep. 21, 1993 [JP] Japan ...................................... 5-234519
Sep. 29, 1993 [JP] Japan ...................................... 5-242450

[51] Int. Cl.$^7$ .................................. H05K 3/10; H05K 3/36
[52] U.S. Cl. .................................. 29/852; 29/846; 29/830; 428/901; 428/320.2
[58] Field of Search ............................... 156/272.2, 307.1; 428/209, 901, 320.2, 321.3, 304.4, 210, 323, 422, 457, 408; 361/748, 750, 398, 399, 400; 29/830, 852, 853, 829, 846

[56] References Cited

U.S. PATENT DOCUMENTS

| | | | |
|---|---|---|---|
| 4,302,501 | 11/1981 | Nagashima | 428/304 |
| 4,383,363 | 5/1983 | Hayakawa et al. | |
| 4,967,314 | 10/1990 | Higgins. | |
| 5,346,750 | 9/1994 | Hatakeyama. | |
| 5,652,042 | 7/1997 | Kawakita et al. | 428/209 |

FOREIGN PATENT DOCUMENTS

| | | |
|---|---|---|
| 530 840 | 3/1993 | European Pat. Off. . |
| 568 930 | 11/1993 | European Pat. Off. . |

OTHER PUBLICATIONS

Patent Abstracts of Japan, vol. 13, No. 230 (May 26, 1989).
Patent Abstracts of Japan, vol. 15, No. 506 (Dec. 20, 1991).
Patent Abstracts of Japan, vol. 17, No. 583 (Oct. 22, 1993).
Patent Abstracts of Japan, vol. 13, No. 413 (Sep. 12, 1989).

*Primary Examiner*—Marion E. McCamish
*Assistant Examiner*—Cheryl Juska
*Attorney, Agent, or Firm*—Morrison & Foerster LLP

[57] ABSTRACT

A connecting member of circuit substrates includes an organic porous base material provided with tackfree films on both sides, through-holes disposed at requested places which are filled with conductive resin compound up to the surface of the tackfree films. This structure enables inner-via-hole connection and can therefore attain a connecting member of circuit substrates and an electrical connector of high reliability and high quality. By using a connecting member of circuit substrates including the organic porous base material provided with tackfree films on both sides and through-holes disposed at requested places which are filled with conductive resin compound up to the surface of the tackfree films, it is possible to form a high-multilayer substrate easily from double sided boards or four-layer substrates which can be manufactured rather stably. In addition to that, since the conductive paste is filled up to the surface of the tackfree films, the conductive paste sticks out from the surface of the organic porous base material when the tackfree films are separated. As a result, the filled amount of the conductive substance increases after the lamination, and thus, the connection resistance is reduced considerably.

30 Claims, 6 Drawing Sheets

CONNECTING MEMBER OF A CIRCUIT SUBSTRATE AND METHOD OF MANUFACTURING MULTILAYER CIRCUIT SUBSTRATES BY USING THE SAME

This application is a division of U.S. application Ser. No. 08/308,982 filed Sep. 20, 1994, now U.S. Pat. No. 5,484,647.

FIELD OF THE INVENTION

This invention relates to a connecting member of a circuit substrate which connects circuit substrates electrically and mechanically, and further relates to a simple method of manufacturing multilayer circuit substrates by using the connecting member of a circuit substrate.

BACKGROUND OF THE INVENTION

Recently, following the tendency of electronic devices toward becoming smaller and lighter, a mounting substrate which is a part of these devices is required to perform higher mounting density. The mounting technique itself has become one of the major elements in the field of development of new electronic devices. This mounting technique can be divided into two components: 1. surface mounting components such as semiconductors or chip components, and 2. substrates for mounting and connecting these components electrically including its mounting method. It is widely known that semiconductors have increasingly more chip sizes and terminals for attaining higher integration density and functional improvements. Therefore, the terminal pitch is tending toward becoming narrower For example, terminal pitch is 0.3 mm at present, whereas the pitch was 0.5 mm in the past. If the pitch were narrower than 0.3 mm, it would be difficult to apply a conventional solder method for mounting. The chip on board (COB) technique, which mounts semiconductors directly on substrates, will be considered more important in the future than the well-known "package". Therefore, the COB technique has been researched in various fields. Furthermore, the tendency toward smaller chip components has developed so far that nowadays 1005 chip (1.0×0.5 mm) is used daily. Similar to the case with semiconductors, it would be difficult to produce smaller chip components than this size since the mounting method causes a limit on size reduction. In addition, mounting costs would be significantly higher.

On the other hand, the dominant current in electronic devices is moving toward digitalized circuits which are accompanied by higher frequency and acceleration. As a result, mounting substrates can no longer sidestep the noise and heat problems. In order to cope with this problem of higher frequency and acceleration, a usual method which is practiced at present is to manufacture a prototype first, and then to modify it again, if any problem should occur. Therefore, a great amount of time has been spent for the development of electronic devices, and this method prolongs the development period. It is desired in the future that the development of substrates is conducted in such a way that a simulation of heat, transmission lines, and noise takes place at the planning stage, and that the results of that simulation are fed back to the substrate planning so that one prototype is enough for completing the process. However, this substrate planning system is still a long way from perfect operation. Thus, a designing method in which know-how from past experience is used is still considered to be in the main stream at the moment. In any case, counter-methods to combat the current toward higher frequency are surely to be based on substrates and mounting forms which have shorter wirings.

As described above, the surface mounting components as well as the substrate techniques are important aspects for attaining electronic devices with high mounting density in the future. At present, one high-density mounting substrate used generally is a glass-epoxy substrate. This substrate is made of glass woven fabrics which are impregnated with epoxy resin to form an insulating substrate material. Glass-epoxy multilayer substrates had been developed for use with computers in the past, but nowadays they are widely applied for consumer use. A method of manufacturing a glass-epoxy multilayer substrate comprises the steps of:

(1) adhering a Cu foil by heat-pressing the above-mentioned material which was made of glass woven fabrics impregnated with epoxy (this is called a prepreg);

(2) patterning the Cu foil by a photolithographic technique to form wiring for an internal layer;

(3) forming a multilayer laminate by further heat-pressing with the use of another prepreg and a Cu foil;

(4) drilling through-holes into the laminate and forming a Cu electrode on the inner wall of the through-holes by an electrolytic plating method, thereby connecting the layers electrically; and (5) etching the Cu surface into patterns.

FIG. 6 is a schematic view of this glass-epoxy multilayer substrate. Referring to FIG. 6, reference numeral 500 denotes an insulating base material made of glass woven fabrics impregnated with epoxy resin; 501, Cu wirings in internal layers; 502, drilled holes made after being formed into a laminated multilayer; 503, a Cu layer on inner walls formed by a plating method; and 504, circuit patterns on the upper most layer. This drill process and the Cu-plated through-holes were established through the development of techniques in which this kind of glass-epoxy base material is used to connect internal layers to outside layers electrically. This method is also widely acknowledged in the world.

However, in view of the demand for higher density in the future as mentioned above, this method can not be considered satisfactory. The reason is that a usual glass-epoxy multilayer substrate is disposed with through-holes which consequently reduce the wiring space. And thus, when high-density wirings are performed, the necessary wirings must take a round about way thereby lengthening the wirings. In addition, it is difficult to conduct an automatic wiring by CAD (computer aided design) because there is not enough space for wiring. Furthermore, following the present tendency of forming smaller holes, the drill processing can not be applied so easily. In fact, this tendency raises the cost ratio of the drill processing within the entire costs. Not only that, the Cu-plating process which is necessary for through-holes is problematic from an environmental point of view.

In order to solve the above-mentioned problems, a number of new multilayer substrates have been developed in the field of multilayer substrates. First, as a technique which applies the method of forming substrates with Cu-plated through-holes by a drill is to form SVH (Semi-Buried Via Hole) multilayer substrates. This method of forming SVH substrates is conducted by means of via connection consisting of not only through-holes, but also via connections on the surface which enables more high-density wirings than with the through-hole-type substrate. Via parts on the surface are filled with insulating resin which are then Cu-plated thereon in order to form mounting pads for components on top of the via parts. According to this method, through-holes for insert components are only present on the surface, and therefore, components can be mounted with high-density.

But this method is an improved technique of forming the above-mentioned glass-epoxy multilayer so that it still suffers from the same problem with the difficulty in drill processing and the necessity for Cu-plating.

On the other hand, new multilayer substrates having a perfect inner-via-hole (IVH: Interstitional Via Hole) structure are disclosed, for example, in a SLC (Surface Laminated Circuit, registered trademark of IBM) substrate and a multilayer substrate using thermoplastic resin. A method of manufacturing SLC substrates comprises the steps of providing a double sided substrate having usual Cu-patterned layers, coating the surface of this substrate with resin as an insulating material, forming via holes by a photolithographic method, adding Cu-plating on the entire surface, and connecting a bottom conductor, a via hole part, and wiring on a surface layer. Then, by applying the same photolithographic method, patterns are formed. This process is repeated to form a multilayer. At present, this method is especially watched with keen interest because it can form highly accurate wirings at an extremely low cost. The problems with this method is that the adhesion strength between the insulating material and the Cu-electrode is low, and substrates can warp easily due to the difference in thermal expansion between the core substrate and the resin.

A multilayer substrate using thermoplastic resin is manufactured by first disposing holes in a thermoplastic sheet-type base material, and printing patterns on the surface of the sheet with conductive resin paste made of silver, and then, by heat-pressing another sheet formed separately on top to form a multilayer substrate. The problem in this case is that the thermoplastic resin does not have heat resistance. In addition, the conductive resin paste has high wiring resistance, and it is also difficult to solder the surface part. Nevertheless, both methods are attracting attention since they have the big advantage of forming multilayer substrates having a perfect inner-via-hole (IVH) structure.

Another technique is disclosed in Laid-open Japanese patent application No. (Tokkai Sho) 50-94495 and in U.S. Pat. No. 3,620,873 in which an electrical connector (rubber connector) was used to connect NESA glass made of liquid-crystal elements and a flexible printed substrate (FPC). This connector is in the form of laminated layers which are piled up such that layers of silicon rubber mixed with carbon black and layers without carbon black are present as alternating layers.

However, the above-mentioned conventional methods have the following problems. First, the conventional structure does not allow the processing of through-holes easily once the substrate is laminated into a multilayer substrate. This constitution presents difficulties for coping with the tendency toward high-density wiring. Namely, it is necessary to process even smaller holes, and it is also difficult to process holes to match the wirings in the internal layers. As for the processing of more minute holes, the diameter of the drill is required to be smaller and smaller, and the costs for processing this kind of drill become significant. It is also anticipated that accurate holes can not be formed in the thickness direction with minute drills. Furthermore, although the accuracy in positioning wirings in an internal layer against wirings on external layers needs to be higher and higher, it is becoming even more and more difficult to process holes at exact places due to a size gap or elongation of substrate materials. It is still a big problem to position internal layers to each other exactly in the present current toward higher build-up layers.

As a result of the problems mentioned above, the conventional substrates used for circuits have a limit in the number of through-hole connections which can be performed per unit area and also in the density of circuit patterns. Therefore, the conventional method presents major difficulties for obtaining multilayer substrates used for high-density mounting which will be more and more in demand.

Furthermore, the rubber connector disclosed in the above-mentioned Laid-open Japanese patent application No. (Tokkai Sho) 50-94495 and in U.S. Pat. No. 3,620,873 had the problem of having high electrical resistance of several $k\Omega/mm^2$ because carbon black is mixed in the silicone rubber.

SUMMARY OF THE INVENTION

An object of this invention is to solve the above problems by providing a connecting member of circuit substrates which enables inner-via-hole connection and has high reliability and high quality. Another object of this invention is to provide a multilayer circuit substrate composed of the above-noted connecting member of circuit substrates. A further object of this invention is to provide a connecting member of circuit substrates which is suitable for an electrical connector of low electrical resistance.

In order to accomplish these and other objects and advantages, a connecting member of circuit substrates in the first embodiment in this invention comprises an organic porous base material provided with tackfree films on both sides, wherein the connecting member of circuit substrates has a plurality of through-holes at desired places, and the through-holes are filled with conductive resin compound up to the surface of the tackfree films.

A second embodiment of this invention is a method of manufacturing a multilayer circuit substrate comprising the steps of: providing a multilayer circuit substrate having at least two layers of circuit patterns, a circuit substrate having at least one layer of circuit pattern, and a connecting member of circuit substrates comprising an organic porous base material provided with tackfree films on both sides, wherein the connecting member has a plurality of through-holes, and the through-holes are filled with conductive resin compound up to the surface of the tackfree films from which the tackfree films are separated, positioning the connecting member of circuit substrates between the multilayer circuit substrate and the circuit substrate, and heating and pressurizing.

A third embodiment of this invention is a method of manufacturing a multilayer circuit substrate comprising the steps of: providing a multilayer circuit substrate having at least two layers of circuit patterns and two pieces of a connecting member of circuit substrates comprising an organic porous base material provided with tackfree films on both sides, wherein the connecting member has a plurality of through-holes, and the through-holes are filled with conductive resin compound up to the surface of the tackfree films from which the tackfree films are separated, positioning the multilayer circuit substrate between the two connecting members of circuit substrates, applying a metal foil on both sides, heating and pressurizing and forming circuit patterns on the metal foils.

It is preferable that the organic porous base material comprises a composite material comprised of nonwoven heat-resisting synthetic fiber fabrics impregnated with thermosetting resin.

Furthermore, it is preferable that the nonwoven heat-resisting synthetic fiber fabrics comprise aramid resin, and that the thermosetting resin is epoxy resin.

It is also preferable that the nonwoven heat-resisting synthetic fiber fabrics comprise paper, and that the thermosetting resin is one compound selected from the group consisting of phenol resin and epoxy resin.

Furthermore, it is preferable that a conductive substance contained in the conductive resin compound is at least one metallic powder selected from the group consisting of silver, nickel, copper and an alloy thereof.

It is preferable that a resin component contained in the conductive resin compound is the same as the thermosetting resin in the organic porous base material. In other words, it is preferable to use, for example, epoxy resin with epoxy resin.

In addition, it is preferable that the multilayer circuit substrate-having at least two layers of circuit patterns and the circuit substrate having at least one layer of circuit pattern each comprise glass-epoxy multilayer circuit substrates having copper foil wirings and copper-plated through-holes.

Furthermore, it is preferable that the multilayer circuit substrate having at least two layers of circuit patterns and the circuit substrate having at least one layer of circuit pattern each comprise aramid nonwoven fabrics and multilayer circuit substrates of thermosetting epoxy resin.

It is preferable that the through-holes are formed by laser irradiation.

Furthermore, it is preferable that the through-holes filled with the conductive resin compound have a diameter of 50 μm to 1 mm.

It is preferable that the through-holes filled with the conductive resin compound have a pitch of 50 μm or more.

It is also preferable that the through-holes filled with the conductive resin compound have an electrical resistance of 0.05 to 5.0 mΩ.

Furthermore, it is preferable that the porous base material has a porosity of from 2 to 35%.

It is also preferable that the heating is carried out at a temperature of from 170 to 260° C.

In addition, it is preferable that the pressurization is carried out at a pressure of from 20 to 80 kg/cm².

According to the above-mentioned embodiment of this invention, a connecting member of circuit substrates comprises an organic porous base material provided with tackfree films on both sides, wherein the connecting member of circuit substrates has through-holes at requested places, and the through-holes are filled with conductive resin compound up to the surface of the tackfree films. This structure enables inner-via-hole connection, and thus, a connecting member of circuit substrates of high reliability and high quality can be attained. Furthermore, it is easy to determine fine pitchs at the conductive parts, and at the same time, this connecting member of circuit substrates is suitable for an electrical connector of low electrical resistance. In other words, this connecting member of circuit substrates is composed of a porous base material having compressibility resistance which comprises a composite material of nonwoven fabrics and thermosetting resin, and the porous base material has holes which are filled with conductive paste up to the surface of the tackfree films.

According to this constitution, it is possible to manufacture connecting members of circuit substrates stably and of high reliability with an ability to determine fine pitchs easily. Therefore, it is possible to form a high-layered substrate from a double sided substrate or a four-layer substrate without complications. In addition, the conductive resin compound is filled up to the surface of the tackfree films so that the conductive paste sticks out from the surface of the organic porous base material when the tackfree films are separated. If this connecting member is used for an electrical connector, these stick-out parts work favorably for electrical connection because electrical connection can take place easily through the stick-out parts.

Next, according to the embodiment of the first manufacturing method of a multilayer circuit substrate in this invention, the connecting member of circuit substrates is held between a multilayer circuit substrate having at least two layers of circuit patterns and a circuit substrate having at least one layer of circuit pattern in which the tackfree films of the connecting member are already separated. And then, the whole assembly is provided with heat and pressure. The organic porous base material used has compressibility resistance and comprises a composite material of nonwoven fabrics and uncured thermosetting resin, and therefore, when the porous base material is compressed by heating and pressurization, the adhesion between the circuit substrates occurs strongly through the thermosetting reaction within the above-mentioned connecting member of circuit substrates, and at the same time, the conductive paste is also compressed in this process. At this moment, a binder component is pressed out between the conductive substances, thereby strengthening the binding between the conductive substance to each other and between the conductive substance and the metal foils. Thus, the conductive substance contained in the conductive paste becomes dense. In addition, since the conductive paste is filled up to the surface of the tackfree films, the conductive paste sticks out from the surface of the organic porous base material when the tackfree films are separated. Accordingly, the filled amount of the conductive substance increases after the lamination, and thus, the connection resistance is reduced considerably.

Furthermore, by using a porous base material having compressibility resistance, the binder component of the conductive paste filled into the through-holes penetrates into the porous base material side. This reduces the filled amount so that the conductive paste does not intrude between the porous base material and the metal foil applied on both sides any more, and accordingly, short-circuits can be prevented from occurring between the adjoining circuit patterns. Furthermore, by using a porous base material having compressibility resistance and comprising the composite material of the nonwoven fabrics and the thermosetting resin, it is not only possible to connect the circuit substrates to each other, but the metal foils for the wirings on the upper most layers are also adhered strongly by heating and pressurization. It is also favorable to the environment that the plating processing is no longer necessary in the manufacturing process of multilayer circuit substrates.

Subsequently, according to the embodiment of the second manufacturing method of a multilayer circuit substrate in this invention, the multilayer circuit substrate is positioned between the two connecting members of circuit substrates from which the tackfree films are already separated. After a metal foil is applied on both sides, it is heated and pressurized, and then, the metal foils are formed into circuit patterns. In this way, multilayer circuit substrates are manufactured efficiently as in the case with the first manufacturing method.

It is preferable that the organic porous base material comprises a composite material which is composed of nonwoven heat-resisting synthetic fiber fabrics impregnated with thermosetting resin. Thus, the multilayer circuit substrate is excellent in thermal and mechanical strength.

Furthermore, it is preferable that the nonwoven heat-resisting synthetic fiber fabrics comprise aramid resin, while the thermosetting resin is epoxy resin. Thus, the multilayer circuit substrate is even more excellent in thermal and mechanical strength.

It is also preferable that the nonwoven heat-resisting synthetic fiber fabrics comprise paper, while the thermosetting resin is selected from the group consisting of phenol resin and epoxy resin. Accordingly, the multilayer circuit substrate is even more excellent in thermal and mechanical strength.

Furthermore, it is preferable that the conductive substance contained in the conductive resin compound is at least one metallic powder selected from the group consisting of silver, nickel, copper and an alloy thereof. As a result, the multilayer circuit substrate is excellent in electrical conductivity.

In addition, it is preferable that the resin component contained in the conductive resin compound is the same as the thermosetting resin in the organic porous base material. Thus, the conductive resin compound has excellent adhesion to the organic porous base material.

Furthermore, it is preferable that the multilayer circuit substrate having at least two layers of circuit patterns and the circuit substrate having at least one layer of circuit pattern comprise glass-epoxy multilayer circuit substrates having copper foil wirings and copper-plated through-holes. As a result, it can be used in combination with conventional glass-epoxy multilayer circuit substrates.

It is preferable that the multilayer circuit substrate having at least two layers of circuit patterns and the circuit substrate having at least one layer of circuit pattern comprise aramid nonwoven fabrics and multilayer circuit substrates of thermosetting epoxy resin, thereby forming multilayer substrates easily.

Furthermore, it is preferable that the through-holes are formed by laser irradiation. This method is more suitable for forming fine-pitched holes than by a drill. In addition, there is no dust created in this process.

It is also preferable that the through-holes filled with the conductive resin compound have a diameter of 50 $\mu$m to 1 mm, thereby forming the conductive part with a desirable diameter. An even more preferable diameter is from 100 to 300 $\mu$m.

Furthermore, it is preferable that the through-holes filled with the conductive resin compound have a pitch (a distance between the filled parts) of 50 $\mu$m or more. As a result, the filled parts are completely insulated from each other.

Additionally, it is preferable that the through-holes filled with the conductive resin compound have an electrical resistance of 0.05 to 5.0 m$\Omega$. This resistance provides good continuity for practical use as a circuit substrate or as a connector. A more preferable range is 0.1 to 0.8 m$\Omega$.

Furthermore, it is preferable that the porous base material has a porosity of from 2 to 35%. This is practical since an "anchor" effect with the conductive paste can be attained.

It is also preferable that the heating is carried out at a temperature of from 170 to 260° C. When a thermosetting resin is used, a hardening reaction can be effectively conducted.

In addition, it is preferable that the pressurization is carried out at a pressure of from 20 to 80 kg/cm$^2$. The substrate has effective properties by substantially diminishing air holes inside the substrate.

As described above, by using the connecting member of circuit substrates comprising the porous base material having compressibility resistance and consisting of a composite material of heat-resisting organic reinforcement and uncured thermosetting resin in which the holes are filled with the conductive paste up to the surface of the tackfree films, it is possible to connect double sided substrates or four-layer substrates to each other electrically and mechanically without any problems, particularly in manufacturing. Therefore, double sided substrates can be easily formed into multilayer substrates having an inner via structure.

As for the porous base material having compressibility resistance, a composite material can be used which is composed of organic reinforcement and uncured thermosetting resin. Therefore, when the porous base material is compressed by heating and pressurization, the conductive paste is also compressed in this process. The organic binder component, pressed out between the conductive substances, hardens and strengthens the binding between the conductive substances and between the conductive substance and the metal foil. Accordingly, the conductive substance within the conductive paste becomes dense. This leads to via connection of extremely low resistance. In addition, since the conductive paste is filled up to the surface of the tackfree films, the conductive paste sticks out from the surface of the organic porous base material when the tackfree films are separated. As a result, the filled amount of the conductive substance increases after the lamination, and thus, the connection resistance is reduced considerably.

In addition, by using a porous base material having compressibility resistance, the binder component of the conductive paste filled into the through-holes penetrates into the porous base material side. This reduces the filled amount so that the conductive paste does not intrude between the porous base material and the metal foil applied on both sides. As a result, short-circuits can be prevented from occurring between adjoining circuit patterns. Furthermore, by using a thermosetting resin of the porous base material having compressibility resistance and comprising the composite material of an organic reinforcement and thermosetting resin, it is not only possible to connect the circuit substrates to each other, but the wirings of metal foils can be connected electrically by heating and pressurization.

It is also favorable to the environment that plating processing is no longer necessary in manufacturing multilayer circuit substrates. As mentioned above, the connecting member of circuit substrates of this invention is suitable for connecting circuit substrates to each other. This connecting member is also effective for connecting circuit substrates to devices electrically and mechanically.

BRIEF DESCRIPTION OF THE DRAWINGS

FIG. 1(a) shows a step in which tackfree films are disposed on both sides of an organic porous base material. FIG. 1(b) shows a step in which through-holes are formed. FIG. 1(c) shows a step in which conductive paste is filled into the through-holes.

FIG. 2(a) shows a connecting member of circuit substrates. FIG. 2(b) shows a step in which a copper foil is applied on both sides of uncured circuit substrate materials. FIG. 2(c) shows a step after being heat-pressed. FIG. 2(d) shows a step after being etched.

DETAILED DESCRIPTION OF THE INVENTION

Figure 1:
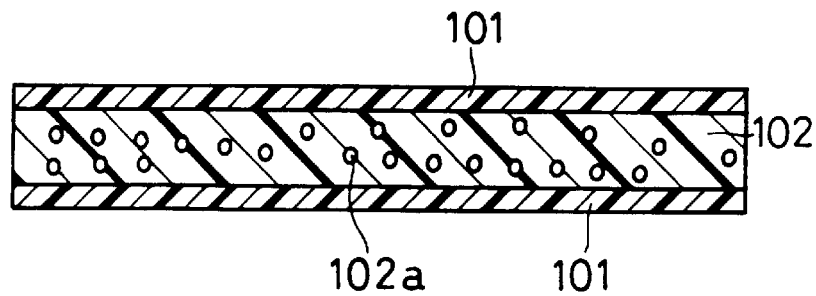
FIG. 1(a)–(c) are cross-sectional views showing a method of manufacturing a connecting member of circuit substrates of a first embodiment to a fourth embodiment of this invention.
Figure 1:
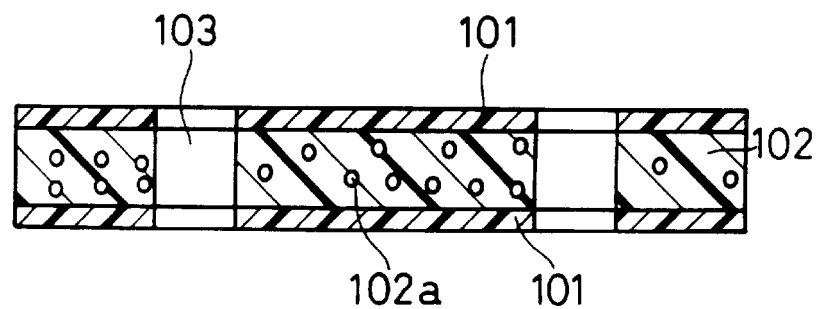
Figure 1:
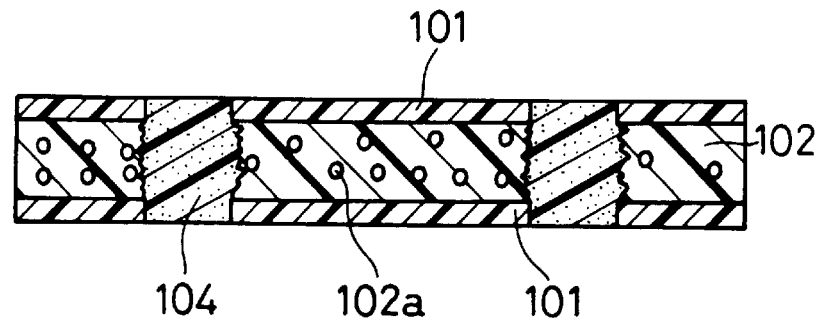

This invention will be described by referring to the following illustrative examples and attached figures.

A connecting member of circuit substrates and a method of manufacturing a multilayer circuit substrate by using the connecting member will be explained in one embodiment of this invention.

(A) Conductive Paste (a) Filler

The conductive paste of this embodiment is composed of a metallic filler, thermosetting resin, and a hardener. First, the conductive filler will be explained. According to the main object of this conductive filler, it should be contained in the conductive compound in high concentration. The reason for this is that, as mentioned above, conductive reliability must be maintained by raising the contact probability of the conductive fillers to each other even if the substrates are distorted due to lower resistance of connected via holes or due to thermal and mechanical stress. In order to disperse the conductive fillers with high concentration, an average particle size of the conductive filler should be preferably from 0.2 to 20 $\mu$m, and should also have as small specific surface as possible. The average diameter can be measured by using a microscopic method or a light scattering method. A preferred value for the average particle size is from 0.1 to 1.5 $m^2$/ g, and more preferably, from 0.1 to 1.0 $m^2$/ g. Silver, copper or nickel are illustrative examples of conductive fillers, and it is also possible to use two different kinds or more of these metals simultaneously. As long as the conductive filler has the characteristics mentioned above, it can be a spherical shape or of a flaked form etc. It is especially desirable to use copper powder as the conductive filler in view of migration control, economic supply, and price stability. But in general, copper powder is easily oxidised, and this oxidation of copper powder can obstruct conductivity when it is used for filling via holes in the connecting member of circuit substrates of this invention. Therefore, the adhesion process by heating and pressurization is preferably conducted in an atmosphere in which the oxygen content is 1.0% or less.

(b) Epoxy Resin

Next, epoxy resin of specific characteristics will be explained. As mentioned above, the connecting member of circuit substrates of this invention is formed by heating and pressurization in a closed state in order to connect the metal foils electrically. Therefore, it is inconvenient to include a volatile constituent such as solvent because it can lead to causing internal blisters. In order to form the conductive compound in one non-solvent type liquid, it is basically necessary to have a liquid resin as the epoxy resin. For the dispersion of the above-mentioned conductive fillers in high concentration, viscosity of the epoxy resin must be 15 Pa's or less. If epoxy resin with higher viscosity than this value is used, the viscosity of the paste made from the conductive compound will be extremely high. As a result, the via hole filling process can not take place any more when the paste viscosity is 2,000 Pa's or higher.

On the other hand, the volatile constituent in this compound should preferably be controlled to prevent the volatile constituent from volatilizing and causing voids and blisters within the structure of the via hole filling or to prevent the prepreg from separating when this compound is heat-compressed after being filled into the via holes. The volatile amount is preferably as small as possible, but the above-noted inconveniences can be avoided when the amount is 2.0 percent by weight or less.

Examples of suitable epoxy resins are liquid-type epoxy resin including two or more epoxy radicals, for example, bisphenol A-type epoxy resin, bisphenol F-type epoxy resin, alicyclic epoxy resin, and amine epoxy resin etc. It is also possible to use liquid-type epoxy resin processed by molecular distillation to reduce the volatile constituent.

With regard to hardeners, any ordinary hardener can be used. Generally used hardeners include amine hardeners, e.g. dicyandiamide and carboxylic acid hydrazide, urea hardeners, e.g. 3-(3,4-dichlorophenyl)-1,1-dimethyl urea, acid anhydride hardeners, e.g. phthalic anhydride, phromellitic acid anhydride, and hexahydro phthalic acid anhydride, and aromatic amine hardeners, e.g. diamide diphenylmethane, diamide diphenylsulfonic acid (amine adduct). It is preferable to use solid-type subclinical hardener powder, particularly in view of stability and workability.

(B) Tackfree Film

Tackfree films in the connecting member of circuit substrates function as pollution control films during the processes of forming holes and filling the conductive paste, but also during transportation. The films are separated when circuit substrates are connected, and therefore, they must have enough adhesion strength until they are used, while they are to be separated easily in use.

Furthermore, the tackfree films are preferably to be adhered in a heated environment at a temperature that the thermosetting resin of the porous base material does not begin to cure. At the same time, the films are preferably of non-heat-contraction-type.

A plastic sheet of about 10 $\mu$m in thickness which is applied with a Si-type lubricant on one side was used in this example. For example, polyethylene terephthalate (hereinafter abbreviated as PET sheet) and PP can be used here.

(C) Prepreg

The base material used in the connecting member of circuit substrates of this embodiment is at least an organic porous base material. However, if this base material is combined with another base material to form a multilayer substrate, a well-known laminated base material can be used. Generally, a laminated base material used for circuit substrates is a composite material of inorganic or organic reinforcement and thermosetting resin. The reinforcement has the functions of strengthening the circuit substrate itself and controlling the warp caused by the heat when parts are mounted on the substrate.

Examples of inorganic reinforcement are glass woven fabrics containing woven glass fibers and nonwoven fabrics consisting of glass fibers cut to a length of several mm to several 10 mm. The glass cloth is made by weaving filaments of 5 to 15 $\mu$m in diameter as warps and twines (yarn) bonding several hundreds pieces as wefts together. The glass which is generally used for printed substrates is composed mainly of $SiO_2$, CaO, $Al_2O_3$, and $B_2O_3$ which are called E-glass. The glass nonwoven fabrics are mainly glass nonwoven paper which is produced by cutting the above-noted glass fibers into paper and adhering them together with water dispersible epoxy resin. Occasionally, an inorganic filler is added for the purpose of improving the dimensional stability.

On the other hand, examples of organic reinforcement are woven or nonwoven fabrics (e.g. commodity name "THERMOUNT" manufactured by E.I.Dupont) made of paper or aromatic polyamide fibers (e.g. commodity name "KEVLAR" manufactured by E.I.Dupont). THERMOUNT (Trademark) used here is produced by first cutting the above-noted KEVLAR fabrics of para-type aramid at a length of about 6.7 mm, adding about 10 to 15% by weight of filmed meta-type aramid to form paper, and calendering under high temperature and high pressure after being dried (e.g. U.S. Pat. No. 4,729,921).

Substrates using aramid are attracting attention for their use in MCM because of the excellent heat resistance and small coefficient of thermal expansion (e.g. IEEE TRANSACTIONS OF COMPONENTS, HYBRIDS, AND MANUFACTURING TECHNOLOGY, VOL.13, NO. 3, SEPTEMBER 1990, PP.570–PP.575).

A prepreg is a composite material consisting of reinforcement and uncured resin in which the above-described reinforcement is impregnated with thermosetting resin from which the solvent is removed. Usually, they are in the form of a glass epoxy prepreg or an aramid epoxy prepreg in which the former prepreg consists of glass woven fabrics and epoxy resin and the latter consists of aramid reinforcement and epoxy resin. The expression "prepreg" is used for expressing the step up to the point where resin cures through heating and pressurization when double sided substrates and multilayer substrates are manufactured.

(D) Thermosetting Resin

Thermosetting resin is an insoluble and infusible macromolecule having a three-dimensional knitting structure of molecules which melt, undergo propagation reaction and crosslinking reaction by heat. A thermosetting resin for printed substrates is selected in view of heat resistance and solvent resistance. Examples include epoxy, phenol, melamine, and polyester. By adding a sub-material, such as a hardener, a modifier or a filler, thermosetting resins of various reaction temperatures can be obtained.

The most generally applied resin is epoxy resin. Epoxy resin is most widely used among different kinds of thermosetting resins and is characterized by excellent mechanical, electrical, and chemical properties. Recently, ordinary epoxy resin is modified in various ways to meet the needs toward higher mounting density and higher heat resistance.

There is also novolak epoxy resin in which novolak-type phenol is used for the purpose of enhancing heat resistance. In some cases, a flame retarder is added to attain not only heat resistance, but also flame resistance.

(E) Copper Foil

A conductor used for metal foil in this example is copper in the form of foil. Thicknesses of 18 to 70 microns are used widely as the copper foils, and they are usually electrolytic copper foils. Copper foil suitable for use in the connecting member of circuit substrates in this invention is placed such that the treated copper foil side is generally used for the electrical connecting surface in view of via connection through the conductive paste. The reason for this is that the treated degree is important with respect to reliability of connection. In other words, the rougher the surface is treated, the better results can be attained in the connection resistance, electrical strength and reliability.

When a multilayer substrate is manufactured by using a connecting member of circuit substrates of this invention, a copper foil which is treated by oxiding treatment can not be used for electrical connecting parts of circuit substrates to be connected. This is due to the fact that the oxide treated side forms a oxide copper layer which is insulated electrically. Therefore, no connection can be achieved. It is preferable that the surface part of copper foil on the substrates to be connected is treated copper foil as mentioned above.

The following embodiments are evaluated by methods shown below.

(1) Via Connection Resistance

The evaluation method of via connection resistance in a circuit substrate manufactured by the connecting member of circuit substrates of this invention is to measure two different resistances, namely, to measure connection resistance per each via and to measure connection resistance when 500 via connections are chained in line for wirings.

The connection resistance per each via is measured by a four-terminal resistance measurement conducted at both ends of metal wirings of both via ends. The serial resistance of 500 pieces can be evaluated in a method which is mainly used for reliability tests. This method is conducted by first adding the resistance for 500 pieces and the resistance of metallic wirings by the above-noted four-terminal measurement method, and then, subtracting the initial resistance amount from the measured amount after the experiment. In other words, this method determines the amount of change in via resistance of 500 pieces.

(2) Various Kinds of Reliability Test in Via Connection

① Heat Cycle Test

A heat cycle test is based on the amount of change in via connection resistance after 30 minutes at −55° C. in vapor phase, and then, after 30 minutes at +125° C. a thousand times. The evaluation standard is that the amount of change in via serial substrate of 500 pieces is 250 mΩ or less. This is equivalent to a change in 0.5 mΩ or less per each via.

② Solder Dipping Test

A solder dipping test is conducted by first dipping for 10 seconds in a solder vessel heated and dissolved at 230° C., and then measuring the amount of change in via connection resistance in the same manner as mentioned above. The evaluation standard is the same as above.

③ Oil-Dipping Test

An oil-dipping test is a heat cycle test conducted in the oil part of a liquid phase. A sample substrate is dipped 10 seconds in the oil which is heated up to 260° C., maintained 10 seconds at room temperature, and further dipped 10 seconds in the oil at 20° C. The evaluation takes place after this heat cycle is repeated 200 times. At this time, it is measured whether the resistance shows no breakage during 200 times when it is dipped in the higher and lower temperature sides. At the same time, the amount of change in resistance is measured and evaluated according to the same evaluation standard mentioned above.

Embodiments will be specifically described in the following illustrative examples.

EXAMPLES 1 to 4

A connecting member of circuit substrates and a method of manufacturing a multilayer circuit substrate by using the connecting member of circuit substrates will be explained by referring to the attached figures in one embodiment of this invention.

In the first place, prepregs used for the connecting member of circuit substrates are shown in Prepreg 1 to 4.

(1) Prepreg 1

Glass woven fabrics as inorganic reinforcement were used in which E-glass of 4.6 micron in filament diameter was twined 4.4 pieces per one inch. As thermosetting resin, epoxy resin with high glass transition point was used which was in this case Shell EPON 1151B60 of 180° C. in the glass transition point. This resin was impregnated by using methylethylketone (MEK) as a deluent solvent. This prepreg line could be dried for both resin impregnation and solvent removal consecutively. The amount of resin after being dried was about 30 wt % against the glass cloth. The thickness of the prepreg after being dried was 120 μm.

(2) Prepreg 2

Glass nonwoven fabrics were also used as inorganic reinforcement, and the impregnated resin was the same with in Prepreg 1. The glass unwoven fabrics used were made into glass nonwoven paper by cutting the above-mentioned glass fabrics to paper and by adhering them together with water dispersible epoxy resin. An inorganic filler of alumina powder was added to improve the dimensional stability. The amount of impregnated resin was about 40 wt % against the glass woven fabrics, and the thickness of the prepreg was 140 μm.

(3) Prepreg 3

Nonwoven fabric paper of aromatic polyamid was used as an organic reinforcement which was in this case "THERMOUNT" manufactured by E.I. Dupont of 72 g/m² in basis weight and 0.5 g/cc in paper density. The impregnated resin was epoxy resin of Dow DER 532A80, and the glass transition point was 140° C. The resin impregnation and the drying process took place in the same method as in Prepreg 1. The amount of impregnated resin was 52 wt %, and the thickness of the prepreg was 150 μm.

(4) Prepreg 4

Paper as an organic reinforcement was also used here which was in this case paper phenol prepreg. The paper used was kraft paper of 70 g/m² in basis weight. Thermosetting resin was modified resin added with alkyl phenol group. The amount of resin was 48 wt % against the kraft paper, and the thickness of the prepreg was 145 μm.

(5) Conductive Paste

Composition of the conductive paste of this invention is shown in TABLE 1. Metallic fillers of silver, copper and nickel were used in a spherical and flake form. The resin compound was bisphenol A-type epoxy resin (EPICOAT 828 manufactured by Yuka Shell Epoxy Co., Ltd.), and the harder used was Amineadduct (MY-24 manufactured by Ajinomoto Co., Ltd.).

Three roles of the above-described compound were kneaded and mixed into paste. TABLE 1 shows the form of the metal particle, the average size of the particle, the mixed amount (% by weight), and the viscosity of the paste of 0.5 rpm in an E-type viscometer at room temperature.

TABLE 1

| Paste No. | Metal | | Resin Compound | | | Viscosity (Pa · s) |
|---|---|---|---|---|---|---|
| | Metal Form | Particle size (μm) | Amount of metal (wt %) | Amount of resin (wt %) | Amount of hardener (wt %) | |
| P-1 | Cu | spherical | 2 | 85 | 12 | 3 | 120 |
| P-2 | Cu | spherical | 2 | 87.5 | 10 | 2.5 | 340 |
| P-3 | Ni | spherical | 1.2 | 85 | 12 | 3 | 300 |
| P-4 | Ni | spherical | 1.2 | 87.5 | 10 | 2.5 | 550 |

TABLE 1-continued

| Paste No. | Metal | | Resin Compound | | | Viscosity (Pa · s) |
|---|---|---|---|---|---|---|
| | Metal Form | Particle size (μm) | Amount of metal (wt %) | Amount of resin (wt %) | Amount of hardener (wt %) | |
| P-5 | Ag | flake | 1.8 | 85 | 12 | 3 | 220 |
| P-6 | Ag | flake | 1.8 | 87.5 | 10 | 2.5 | 475 |

FIGS. 1(a) to (c) are cross-sectional views showing a method of manufacturing a connecting member of circuit substrates in the embodiment of this invention by using the above-mentioned Prepregs 1 to 4. As shown in FIG. 1(a), a porous base material 102 (Prepreg 3) was prepared which was provided with tackfree films 101 (thickness of about 12 μm) made of polyester on both sides. The method of applying the tackfree films is to position the above prepreg between the tackfree films, and to position it further between stainless steel plates. After that, it is heated four minutes at a temperature of 110° C. and pressurized with 20 Kg/cm². At this moment, the prepreg is compressed by the heating and pressurization so that internal pores 102a decrease.

Accordingly, an aramid-epoxy sheet having tackfree films is obtained. Next, through-holes 103 (diameter of about 250 μm) were formed into aramid-epoxy sheet 102 (thickness of about 130 μm) at predetermined places by a carbon dioxide laser, as shown in FIG. 1(b). Subsequently, as shown in FIG. 1(c), conductive paste 104 is filled into through-holes 103 to form the connecting member of circuit substrates of this invention. Regarding the filling method of conductive paste 104, aramid-epoxy sheet 102 having through-holes 103 was placed on a table of a printing machine (not shown), and conductive paste 104 was printed directly from above on tackfree films 101. Tackfree film 101 on the upper surface serves as a printing mask and also prevents the surface of aramid-epoxy sheet 102 from soiling.

EXAMPLES 5 to 8

A method of manufacturing a double sided printed circuit substrate by using the connecting members of circuit substrates will be explained which are manufactured according to Examples 1 to 4.

Figure 2:
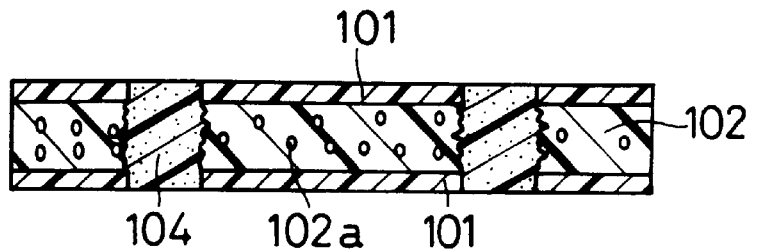
FIG. 2(a)–(d) are cross-sectional views showing a method of manufacturing a multilayer circuit substrate by means of a connecting member of circuit substrates of a fifth embodiment to a eighth embodiment of this invention.
Figure 2:
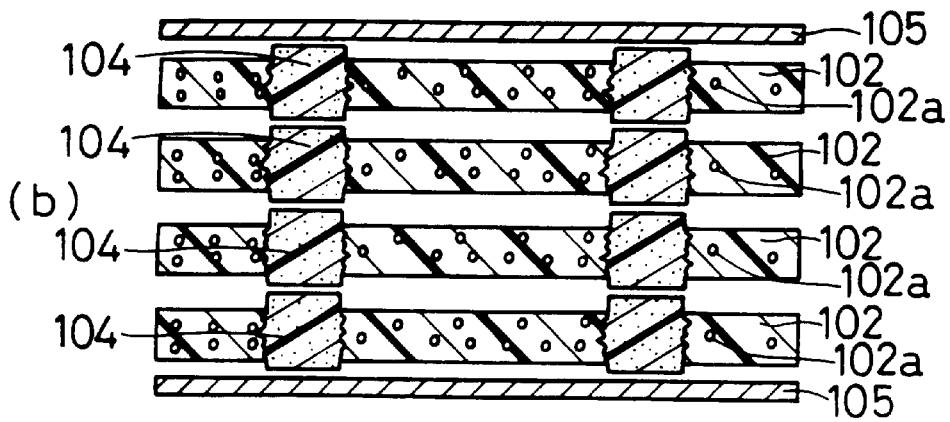
Figure 2:
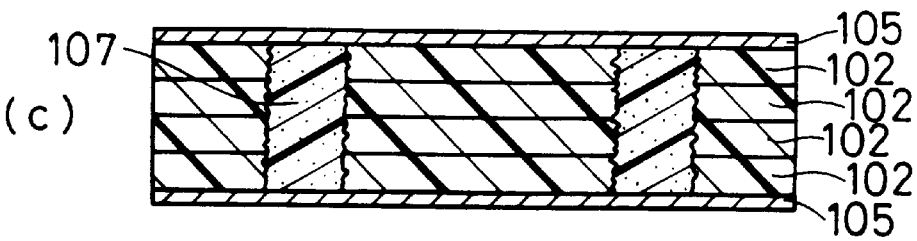
Figure 2:
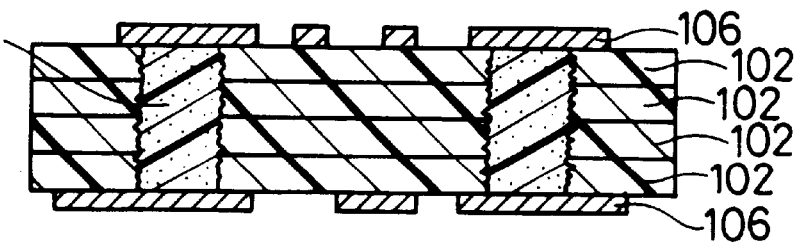

FIG. 2(a) shows the above-noted connecting member of circuit substrates. Tackfree films 101 were separated from both sides of the connecting member of circuit substrates. Besides, three sheets of uncured substrate material filled with the conductive paste at the same places were prepared and laminated by positioning them by means of a basic pin (not shown).

As shown in FIG. 2(b), the uncured circuit substrate materials were laminated, and further, copper foil 105 of 35 μm in thickness each having one treated side which faces inside was applied. By heating and pressurization about one hour at a temperature of 170° C. with 40 Kg/cm² in vacuum by heat-pressing, the substrates were cured and adhered to the copper foils. Reference numeral 107 shows conductive resin compound after being cured. FIG. 2(c) shows a state after being laminated. After that, circuit patterns 106 on the upper most layer were formed by means of a photolithography method. This process can be more precisely described as follows. Dry films were applied on both sides of the above-mentioned laminated substrate by a heat roll, and patterns were exposed through ultraviolet in order to harden only the parts where the copper foil is to remain. Thereafter, uncured parts were eliminated in a developing process, and then, the foils were etched in a copper chloride solution. Further, excessive dry films were separated, and circuit patterns were formed in a usual method. FIG. 2(d) is a completed view of the double sided circuit substrate of this embodiment. Evaluation results of the double sided circuit substrate manufactured in this manner are shown in TABLE 2.

TABLE 2

| Example No. | Prepreg No. | Conductive paste No. | Via resistance mΩ/via | Via connection reliability (ΔR mΩ/500 via) | | |
|---|---|---|---|---|---|---|
| | | | | Heat cycle after 1000 cycles | Solder dipping after 10 seconds | Oil-dipping after 200 cycles |
| 5a | 1 | P-1 | 12.8 | 22 | 45 | 155 |
| 5b | 1 | P-2 | 6.1 | 15 | 23 | 87 |
| 5c | 1 | P-3 | 35.9 | −103 | −55 | 11 |
| 5d | 1 | P-4 | 17.5 | −45 | −15 | 57 |
| 5e | 1 | P-5 | 12.3 | 155 | 187 | 205 |
| 5f | 1 | P-6 | 14.3 | 88 | 122 | 117 |
| 6a | 1 | P-1 | 10.8 | 33 | 35 | 53 |
| 6b | 1 | P-2 | 7.2 | 25 | 18 | 53 |
| 6c | 1 | P-3 | 25.3 | 3 | −21 | −21 |
| 6d | 1 | P-4 | 18.2 | −5 | −19 | 33 |
| 6e | 1 | P-5 | 9.1 | 198 | 215 | 198 |
| 6f | 1 | P-6 | 4.3 | 76 | 113 | 112 |
| 7a | 1 | P-1 | 1.8 | 56 | 24 | 76 |
| 7b | 1 | P-2 | 1.2 | 37 | 13 | 34 |
| 7c | 1 | P-3 | 15.3 | −99 | −12 | 89 |
| 7d | 1 | P-4 | 7.2 | −76 | −11 | 122 |
| 7e | 1 | P-5 | 2.1 | 19 | 112 | 198 |
| 7f | 1 | P-6 | 1.3 | 22 | 62 | 109 |
| 8a | 1 | P-1 | 3.8 | 78 | 47 | 97 |
| 8b | 1 | P-2 | 2.9 | 7 | 63 | 23 |
| 8c | 1 | P-3 | 31.3 | −203 | 22 | 11 |
| 8d | 1 | P-4 | 22.1 | −134 | 5 | 98 |
| 8e | 1 | P-5 | 15.1 | 285 | 85 | 101 |
| 8f | 1 | P-6 | 9.6 | 118 | 45 | 61 |

Each connection resistance of the through-holes in the double sided substrates showed an extremely low amount of about 1.2 mΩ to 35.9 mΩ per each through-hole. Furthermore, as a result of several reliability tests conducted to the double sided circuit substrates, the rates of resistance change were 250 mΩ or less in both oil-dipping and solder dipping tests (230° C., 10 seconds), and there was no breakage in the oil-dipping test. Therefore, results can be valued as satisfactory in all cases.

EXAMPLES 9 to 12

Figure 3:
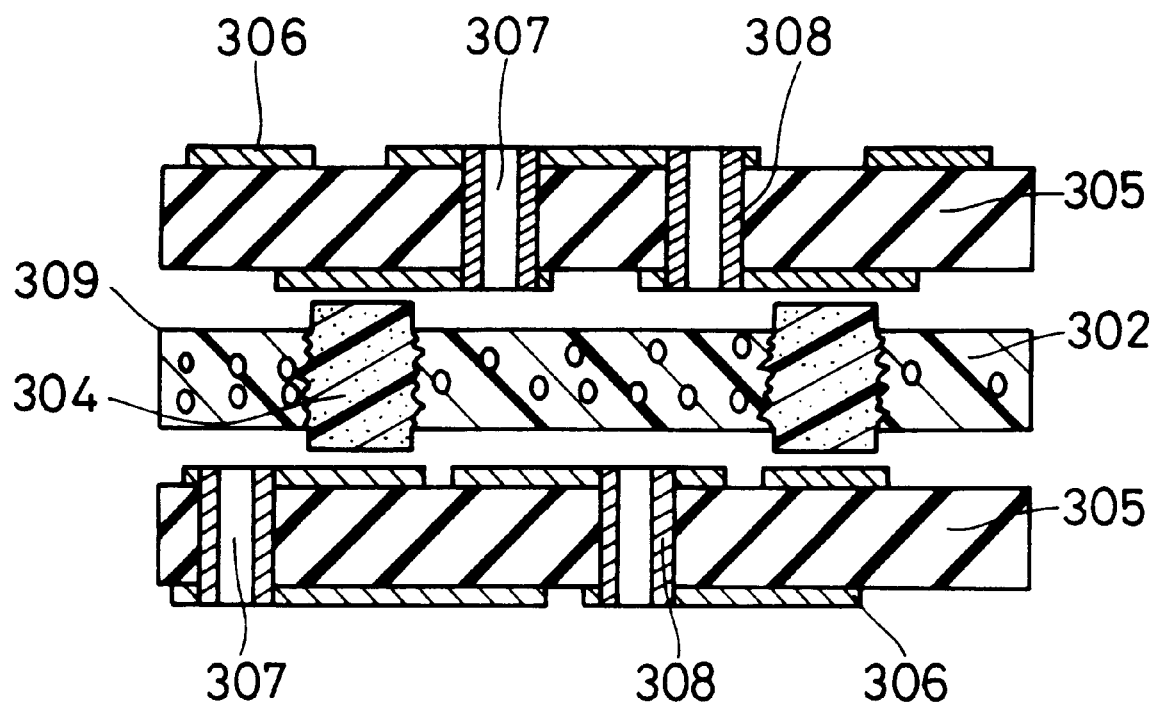
FIG. 3 is a cross-sectional view of a multilayer circuit substrate using a connecting member of circuit substrates of a ninth embodiment to a twelfth embodiment of this invention.

Next is a description of a method of manufacturing a multilayer circuit substrate by using the connecting member of circuit substrates of this invention. Circuit substrates to be combined were two pairs of double sided board comprising glass-epoxy substrate. This glass-epoxy double sided boards were produced from glass woven fabrics laminated with four sheets of prepreg (thickness of about 100 μm) which is impregnated with thermosetting resin equivalent to FR-4, as in the above-mentioned case. Then, a copper foil which was treated on both sides was laminated with a thickness of 35 μm on both sides of the substrates. By heating and pressurizing about one hour at a temperature of 170° C. and with 40 Kg/cm² in vacuum by heat-pressing, the substrates were cured and adhered to the copper foils. The substrates manufactured in this manner were disposed with holes of 0.6 mm in diameter at predetermined places by using a drill machine, and the substrates were further processed by a copper-plating method to form copper-plated films on the inner wall of the through-holes and on the entire upper surface. After that, circuit patterns were formed by means of a photolithography method to form wirings on the upper layers. The glass epoxy double sided board manufactured in this way and another glass epoxy double sided board with different patterns manufactured in the same way were used to position the connecting member of circuit substrates of the above-mentioned first to the fourth embodiments from which the tackfree films had been separated on both sides. They were positioned for lamination and subjected to heat and pressurization by heat-pressing under the same conditions as mentioned above. FIG. 3 shows a cross-sectional view of this embodiment before being laminated. Referring to FIG. 3, reference numeral 305 is a glass-epoxy substrate; 307, drilled holes; 308, a copper-plated inner wall; and 306, circuit patterns of copper. Connecting member of circuit substrates 309 is placed between the above-mentioned double sided boards.

In this structure, the above-noted double sided boards have a connecting land at places to be connected electrically, and the land part is positioned to meet conductive paste 304 of the connecting member of circuit substrates mentioned above. It is therefore necessary to be arranged in such a way that the drilled through-hole parts do not come in contact with the conductive paste part of the above-mentioned connecting member of circuit substrates. The multilayer member manufactured in this manner is a four-layer substrate having four layers of circuit patterns in which the epoxy resin of the above-mentioned connecting member of circuit substrates flowed into the through-hole parts of the above-noted double sided board, thereby forming a complete closed structure. This four-layer substrate was tested and the results of different reliability tests are shown in TABLE 3.

TABLE 3

| Example No. | Circuit connecting member No. | Conductive paste No. | Via resistance mΩ/via | Via connection reliability (ΔR mΩ/500 via) | | |
|---|---|---|---|---|---|---|
| | | | | Heat cycle after 1000 cycles | Solder dipping after 10 seconds | Oil-dipping after 200 cycles |
| 9 | 5b | P-2 | 0.51 | 16 | 21 | 89 |
| 10 | 6b | P-2 | 0.45 | 9 | 14 | 55 |
| 11 | 7b | P-2 | 0.44 | −3 | 5 | 33 |
| 12 | 8b | P-2 | 0.45 | −15 | 2 | 71 |

As shown in TABLE 3, the results of the heat cycle test, solder dipping test, and oil-dipping test indicated satisfactory in all cases.

In this manufacturing method of multilayer substrates, aramid-epoxy double sided substrate (Example 7) manufactured by the connecting member of circuit substrates was also used instead of the glass-epoxy double sided circuit substrate held between the above-mentioned connecting members of circuit substrates with the same satisfactory properties being achieved EXAMPLES 13 to 16

The connecting member of circuit substrates will be explained in this embodiment of the invention. The same connecting member of circuit substrates was used as in the first embodiment to the fourth embodiment.

Figure 4:
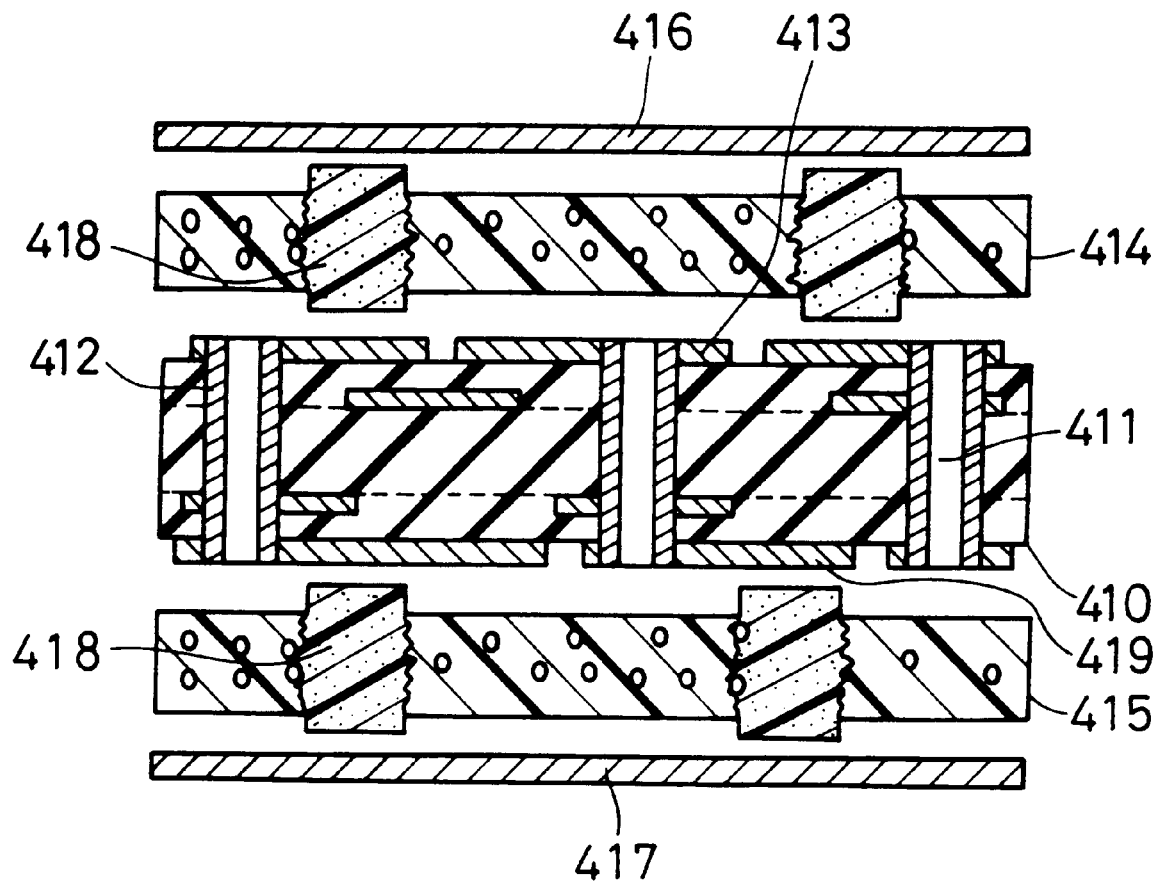
FIG. 4 is a cross-sectional view of a multilayer circuit substrate using a connecting member of circuit substrates of a thirteenth embodiment to a sixteenth embodiment of this invention.

FIG. 4 is a cross-sectional view of a multilayer circuit substrate before being laminated in one embodiment of this invention, and the description follows by referring to the figure. A circuit substrate to be combined was a four-layer substrate consisting of a glass-epoxy substrate. This four-layer substrate was manufactured from glass woven fabrics laminated with four sheets of the prepreg (thickness of about 100 μm) impregnated with thermosetting resin as in the case mentioned above. Then, a copper foil which was treated on one side was applied with a thickness of 35 μm on both sides of the substrates. By heating and pressurizing about one hour at the temperature of 170° C. and 40 Kg/cm$^2$ in vacuum by heat-pressing, the substrate was cured and adhered to the copper foils. After the copper foils were adhered, a photolithography method was used to form circuit patterns. In particular, dry films were applied on both sides by using a laminater, and then patterns were exposed. After that, the processes of development, etching and separation of the dry films followed. Subsequently, the copper foil surface of the substrate with the above patterns was treated, and further, two sheets of the above-noted prepreg were disposed on both sides. The treated surface of the one-side treated copper foil was placed on both sides such that the treated surfaces face inside, and they were laminated once more by heat-pressing. This substrate was disposed with holes of 0.6 mm in diameter at requested places by using a drill machine.

Then, copper-plating was applied on the inner wall of the through-holes and the entire upper layer part to form copper-plated films. After that, circuit patterns were formed on the upper layer by means of a photolithography method. The four-layer glass epoxy substrate manufactured in this manner was placed as an intermediate layer between the connecting members of circuit substrates from which the tack-free films had been separated on both sides. As shown in FIG. 4, they were positioned for the lamination together with the one-side treated copper foils and were subjected to heating and pressurization by heat-pressing under the same conditions as mentioned above. The copper foils on the surface of this multilayer substrate were formed into patterns by the same photolithographic method. Referring to FIG. 4, reference numeral 410 denoted the above-mentioned four-layer glass-epoxy substrate; 411, drilled holes; 412, a copper-plated inner wall; and 413, circuit patterns of copper formed by the photolithographic method. The above-noted four-layer glass-epoxy substrate was held between connecting members of circuit substrates 414 and 415, which are again held between one-side treated copper foils 416 and 417.

In this structure, the above-noted four-layer substrate and the connecting members of circuit substrates have connecting land 419 at places to be connected electrically and conductive paste part 418. The above-mentioned land part was positioned to meet conductive paste 418 of the connecting members of circuit substrates mentioned above. It is therefore necessary to position in such a way that the drilled through-hole parts do not come in contact with the conductive paste part of the above-mentioned connecting members of circuit substrates. A multilayer member manufactured in this manner is a six-layer substrate having six layers of wirings in which the above-mentioned connecting members of circuit substrates are filled with the epoxy resin flowed into the through-hole parts of the above-noted double sided board, thereby forming a complete closed structure. This multilayer substrate was tested and the results of different reliability tests are shown in TABLE 4.

TABLE 4

| Example No. | Circuit connecting member No. | Conductive paste No. | Via resistance mΩ/via | Via connection reliability (ΔR mΩ/500 via) | | |
|---|---|---|---|---|---|---|
| | | | | Heat cycle after 1000 cycles | Solder dipping after 10 seconds | Oil-dipping after 200 cycles |
| 13 | 5b | P-2 | 1.21 | 45 | 38 | 101 |
| 14 | 6b | P-2 | 2.22 | 27 | 29 | 79 |
| 15 | 7b | P-2 | 1.78 | 19 | 39 | 83 |
| 16 | 8b | P-2 | 1.15 | 41 | 52 | 72 |

As shown in TABLE 4, the results of the heat cycle test, solder dipping test, and oil-dipping test were satisfactory in all cases.

Furthermore, it is possible to manufacture a multilayer circuit substrate with even more layers by repeating the above process for a needed number of times. Another method of obtaining a substrate with multilayer circuit patterns is to prepare a desirable number of the above-mentioned intermediate multilayer member and the connecting member of circuit substrates and to laminating them at once.

In this manufacturing method of multilayer substrates, the aramid-epoxy double sided substrate (Example 7) manufactured by the above-noted connecting member of circuit substrates was used instead of the four-layer glass-epoxy circuit substrate held between the connecting members of circuit substrates with the same satisfactory properties being shown.

In the method of manufacturing multilayer circuit substrates as described above, the circuit substrates and the connecting members of circuit substrates used had been already checked so that a high processing yield could be preserved at a controlled cost increase.

In the multilayer circuit substrates manufactured according to the method mentioned above, the first circuit substrate and the second circuit substrate are connected to each other through the compressibility of the connecting members of circuit substrates by heating and pressurization. As a result, a highly laminated substrate can be manufactured rather easily.

EXAMPLE 17

Figure 5:
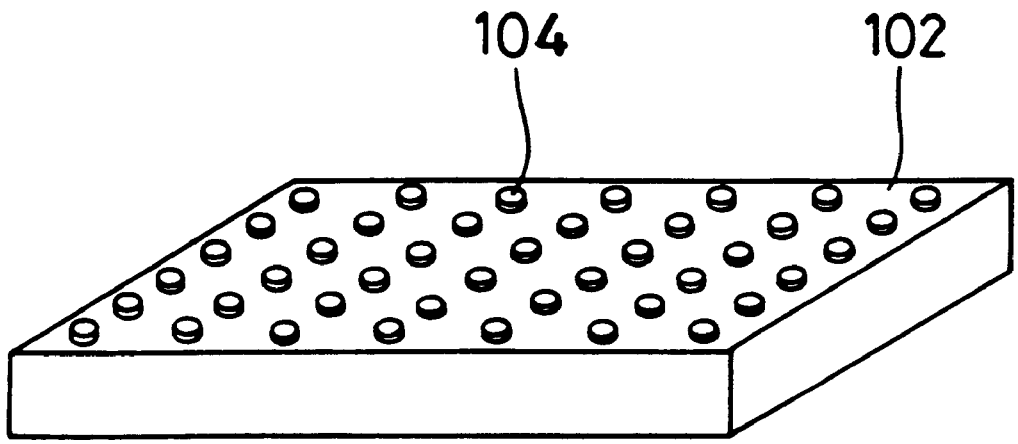
FIG. 5(a) is a perspective view and FIG. 5(b) is a cross-sectional view of an electrical connector using a connecting member of circuit substrates in a seventeenth embodiment of this invention.
Figure 5:
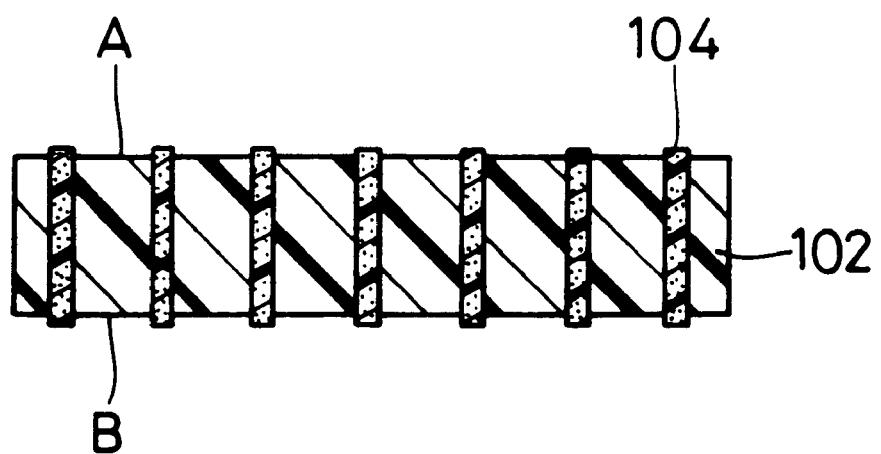
Figure 6:
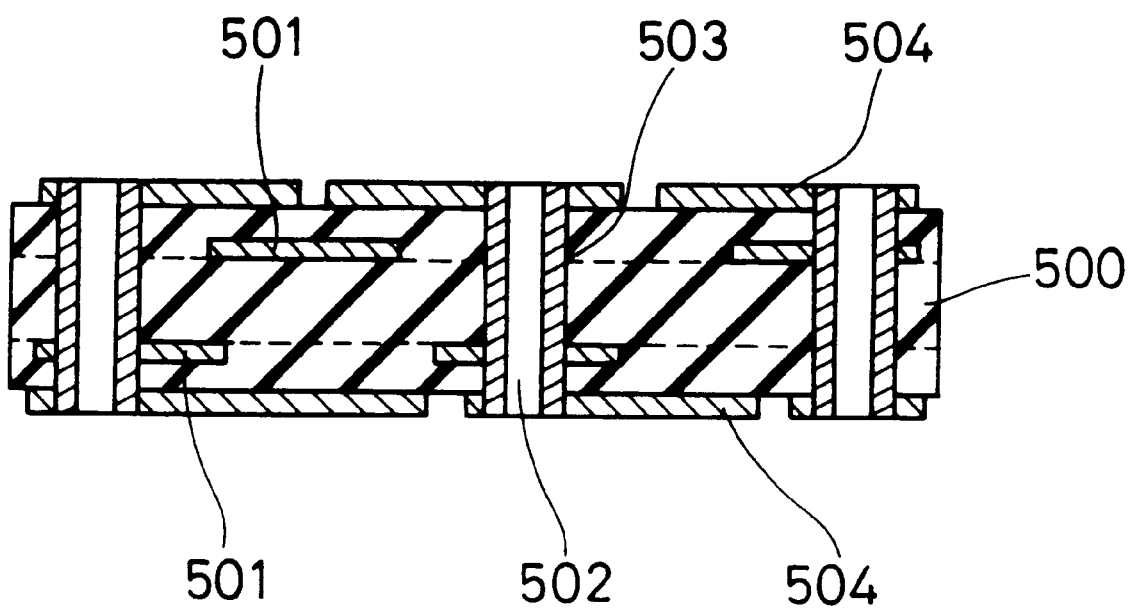
FIG. 6 is a cross-sectional view showing a glass-epoxy multilayer substrate manufactured in a conventional method.

The porous base material of about 150 to 170 μm in thickness which was used in the first embodiment was applied on both sides with fluorocarbon tackfree films (tetrafluoroethylene-ethylene copolymer manufactured by Asahi Garasu Co., Ltd., commodity name: Aflex) of about 30 μm in thickness. Next, an excimer laser was used to form through-holes of about 200 μm in diameter. The distance (pitch) between the holes was set at about 200 μm. Subsequently, conductive paste was filled into the through-holes. Regarding the filling method of the conductive paste, an aramid-epoxy sheet having through-holes was placed on a table of a printing machine (not shown), and the conductive paste 104 was printed directly from above on tackfree films 1. At this moment, the tackfree film on the upper surface serves as a printing mask and also prevents the surface of the aramid-epoxy sheet from soiling. The conductive paste used was silver powder with an average diameter of 2 μm as conductive filler, and the resin was the same thermosetting epoxy resin (non-solvent type) as in the above-noted substrate material. A hardener was obtained by kneading and mixing three roles of acid anhydride-type hardener each having 85, 12.5, and 2.5 by weight sufficiently. After that, the substrate was subjected to heat and pressure for one hour at a temperature of 170° C. and pressure of 40 kg/cm² in vacuum. Then, the tackfree films were separated, thereby obtaining an electrical connector of about 100 µm in thickness. FIGS. 5(a) and (b) are examples of electrical connectors obtained in the manner mentioned above. FIG. 5(a) is a perspective view of an electrical connector, and FIG. 5(b) is a cross-sectional view of the same. Referring to FIGS. 5(a) and (b), reference numeral 102 denotes an organic porous base material (aramid epoxy sheet); and 104, conductive resin compound part. This electrical connector can conduct electricity only in the vertical direction, not in the horizontal direction. Furthermore, conductive resin compound 104 is formed with a pitch of three roles per 1 mm. Conductive resin compound 104 sticks out about 30 µm which makes it suitable for connecting NESA glass of liquid-crystal elements and a flexible printed substrate (FPC). Additionally, when an adhesive is applied on surface A and surface B, it can easily stick to other circuit substrates.

The connecting member of circuit substrates of the above-mentioned embodiment can be used, for example, as an electrical connector for connecting NESA glass of liquid-crystal elements and a flexible printed substrate (FPC) or as an electrical connector for connecting a driver circuit of electrical signal conductor in a movable telephone and a FPC.

According to the embodiments of this invention as described above, by using the connecting member of circuit substrates comprising the porous base material having compressibility resistance and consisting of a composite material of nonwoven fabrics and thermosetting resin which are also provided with tackfree films and holes filled with the conductive paste up to the surface of the tackfree films, it is possible to form a high-layered substrate easily from double sided boards or four-layer substrates which can be manufactured rather stably. When the connecting member of circuit substrates of the embodiments is used, the porous base material is compressed by heating and pressurization so that the conductive paste is also compressed. During this process, a binder component which is pressed out between the conductive substances strengthens the binding between the conductive substance to each other and between the conductive substance and the metal foil, and accordingly, the conductive substance contained in the conductive paste becomes dense. In addition to that, since the conductive paste is filled up to the surface of the tackfree films, the conductive paste sticks out from the surface of the organic porous base material when the tackfree films are separated. As a result, the filled amount of the conductive substance increases after the lamination, and thus, the connection resistance is reduced considerably.

Furthermore, by using the porous base material having compressibility resistance and comprising a composite material of nonwoven fabrics and thermosetting resin, it is not only possible to connect the circuit substrates to each other, but the metal foil for wirings on the upper most layer can be also adhered strongly by heating and pressurization. It is also favorable to the environment that a drilling process or a plating process is not necessary any more in the manufacturing process of multilayer circuit substrates.

According to the above-mentioned invention, the connecting member of circuit substrates comprises an organic porous base material provided with tackfree films on both sides, wherein the connecting member for circuit substrates has through-holes at requested places, and the through-holes are filled with conductive resin compound up to the surface of the tackfree films. This structure enables inner-via-hole connection and can therefore attain the connecting member of circuit substrates of high reliability and high quality. Additionally, it is easy to determine fine pitchs at the conductive parts, and an electrical connector of low electrical resistance can be attained.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A method of manufacturing a multilayer circuit substrate comprising the steps of:
    (a) providing at least two circuit substrates, wherein each circuit substrate has at least one layer of circuit patterns;
    (b) providing at least one connecting member for connecting said circuit substrates, wherein said connecting member comprises an organic porous base material having a top surface and a bottom surface, each surface having a tack free film disposed thereon, and each connecting member has at least one means defining a through hole running throughout the connecting member, each through hole being filled with conductive resin compound up to the surface of each tackfree film;
    (c) separating each tackfree film from said connecting member such that the conductive resin compound sticks out from the surface of the organic porous base material at substantially the same thickness as that of the tack free film;
    (d) positioning said connecting member between the circuit substrates; and
    (e) heating and pressurizing.

2. The method of manufacturing a multilayer circuit substrate as in claim 1, wherein said organic porous base material is a composite material which comprises a nonwoven heat-resisting synthetic fiber fabric impregnated with uncured thermosetting resin.

3. The method of manufacturing a multilayer circuit substrate as in claim 2, wherein said nonwoven heat-resisting synthetic fiber fabric comprises aramid resin, and said uncured thermosetting resin is epoxy resin.

4. The method of manufacturing a multilayer circuit substrate as in claim 2, wherein said nonwoven heat-resisting synthetic fiber fabric comprises paper, and said uncured thermosetting resin is selected from the group consisting of phenol resin and epoxy resin.

5. The method of manufacturing a multilayer circuit substrate in claim 1, wherein a conductive substance is contained in said conductive resin compound and the conductive substance comprises at least one metallic powder selected from the group consisting of silver, nickel, copper, silver alloy, nickel alloy, and copper alloy.

6. The method of manufacturing a multilayer circuit substrate as in claim 1, wherein a resin component is contained in said conductive resin compound and the resin component is comprised of the same material as the thermosetting resin in said organic porous base material.

7. The method of manufacturing a multilayer circuit substrate as in claim 1, wherein said circuit substrates comprise glass-epoxy substrates having copper foil wirings and copper-plated through-holes.

8. The method of manufacturing a multilayer circuit substrate as in claim 1, wherein said circuit substrates comprise aramid nonwoven fabrics and thermosetting epoxy resin.

9. The method of manufacturing a multilayer circuit substrate as in claim 1, wherein said through-holes are formed by laser irradiation.

10. The method of manufacturing a multilayer circuit substrate as in claim 1, wherein said through-holes filled with the conductive resin compound have a diameter of 50 µm to 1 mm.

11. The method of manufacturing a multilayer circuit substrate as in claim 1, wherein said through-holes filled with the conductive resin compound have a pitch of 50 µm or more.

12. The method of manufacturing a multilayer circuit substrate as in claim 1, wherein said through-holes filled with the conductive resin compound have an electrical resistance of 0.05 to 5.0 mΩ.

13. The method of manufacturing a multilayer circuit substrate as in claim 1, wherein said porous base material has a porosity of from 2 to 35% before heating and pressurization.

14. The method of manufacturing a multilayer circuit substrate as in claim 1, wherein heating is carried out at a temperature of from 170 to 260 ° C.

15. The method of manufacturing a multilayer circuit substrate as in claim 1, wherein pressurizing is carried out at a pressure of from 20 to 80 kg/cm².

16. A method of manufacturing a multilayer circuit substrate comprising the steps of:

(a) providing a multilayer circuit substrate having at least two layers of circuit patterns and providing at least two connecting members, wherein each connecting member comprises an organic porous base material having a top surface and a bottom surface, each surface having a tackfree film disposed thereon, and each connecting member has at least one means defining a through hole running throughout the connecting member, each through hole being filled with conductive resin compound up to the surface of each tackfree film;

(b) separating each tackfree film from each connecting member such that the conductive resin compound sticks out from the surface of the organic porous base material at substantially the same thickness as that of the tackfree film;

(c) positioning said multilayer circuit substrate between the connecting members;

(d) applying metal foil to at least one surface of each connecting member; and (e) heating, pressurizing, and forming circuit patterns on said metal foils.

17. The method of manufacturing a multilayer circuit substrate as in claim 16, wherein said organic porous base material is a composite material which comprises a non-woven heat-resisting synthetic fiber fabric impregnated with an uncured thermosetting resin.

18. The method of manufacturing a multilayer circuit substrate as in claim 17, wherein said nonwoven heat-resisting synthetic fiber fabrics comprise aramid resin, and said uncured thermosetting resin is epoxy resin.

19. The method of manufacturing a multilayer circuit substrate as in claim 17, wherein said nonwoven heat-resisting synthetic fiber fabric comprises paper, and said uncured thermosetting resin is selected from the group consisting of phenol resin and epoxy resin.

20. The method of manufacturing a multilayer circuit substrate as in claim 16, wherein a conductive substance is contained in said conductive resin compound and the conductive substance comprises at least one metallic powder selected from the group consisting of silver, nickel, copper, silver alloy, nickel alloy, and copper alloy.

21. The method of manufacturing a multilayer circuit substrate in claim 16, wherein a resin component is contained in said conductive resin compound and the resin component is comprised of the same material as the thermosetting resin in said organic porous base material.

22. The method of manufacturing a multilayer circuit substrate as in claim 16, wherein said multilayer circuit substrate having at least two layers of circuit patterns comprises glass-epoxy multilayer circuit substrates having copper foil wirings and copper-plated through-holes.

23. The method of manufacturing a multilayer circuit substrate as in claim 16, wherein said multilayer circuit substrate having at least two layers of circuit patterns comprises aramid nonwoven fabrics and thermosetting epoxy resin.

24. The method of manufacturing a multilayer circuit substrate as in claim 16, wherein said through-holes are formed by laser irradiation.

25. The method of manufacturing a multilayer circuit substrate as in claim 16, wherein said through-holes filled with the conductive resin compound have a diameter of 50 µm to 1 mm.

26. The method of manufacturing a multilayer circuit substrate as in claim 16, wherein said through-holes filled with the conductive resin compound have a pitch of 50 µm or more.

27. The method of manufacturing a multilayer circuit substrate as in claim 16, wherein said through-holes filled with the conductive resin compound have an electrical resistance of 0.05 to 5.0 mΩ.

28. The method of manufacturing a multilayer circuit substrate as in claim 16, wherein said porous base material has a porosity of from 2 to 35% before heating and pressurization.

29. The method of manufacturing a multilayer circuit substrate as in claim 16, wherein heating is carried out at a temperature of from 170 to 260° C.

30. The method of manufacturing a multilayer circuit substrate as in claim 16, wherein pressurizing is carried out at a pressure of from 20 to 80 kg/cm².

* * * * *